United States Patent [19]

Lee et al.

[11] Patent Number: 5,674,618
[45] Date of Patent: Oct. 7, 1997

[54] BIAXIALLY ORIENTED POLYESTER FILM

[75] Inventors: Kwang-Hyung Lee; Seung-Soo Woo, both of Kyungki-do, Rep. of Korea

[73] Assignee: SKC Limited, Kyungki-do, Rep. of Korea

[21] Appl. No.: 761,995

[22] Filed: Dec. 12, 1996

[30] Foreign Application Priority Data

Dec. 13, 1995 [KR] Rep. of Korea ............ 95-49287
Dec. 13, 1995 [KR] Rep. of Korea ............ 95-49288

[51] Int. Cl.$^6$ .................................. B32B 15/02
[52] U.S. Cl. ............... 428/402; 528/281; 528/302; 528/308.6; 524/783; 524/789
[58] Field of Search ............... 528/281, 302, 528/308.6; 524/783, 789; 428/402

[56] References Cited

U.S. PATENT DOCUMENTS

| | | | |
|---|---|---|---|
| 4,678,831 | 7/1987 | Kawabata et al. | 524/496 |
| 5,188,891 | 2/1993 | Takeda et al. | 428/323 |
| 5,304,324 | 4/1994 | Yoneda et al. | 252/309 |
| 5,306,538 | 4/1994 | Kurihara et al. | 428/141 |
| 5,316,714 | 5/1994 | Yoneda et al. | 264/210.6 |
| 5,434,000 | 7/1995 | Konagaya et al. | 428/329 |

*Primary Examiner*—Samuel A. Acquah
*Attorney, Agent, or Firm*—Anderson Kill & Olick P.C.

[57] ABSTRACT

A biaxially oriented polyester film which contains 0.01 to 5 wt % of zinc oxide having an average particle diameter ranging from 0.01 to 5 μm has improved transparency, UV light shielding ability and surface properties, and it is especially useful as wrapping materials for food, labels, window coating films, photoresists and the like. The zinc oxide may be optionally pretreated with a silane coupling agent of formula (I):

$$R^1-R^2-Si-(OR^3)_3 \qquad (I)$$

wherein, $R^1$ is a methacryl

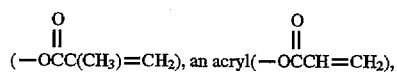
$(-OCC(CH_3)=CH_2)$, an acryl $(-OCCH=CH_2)$, an epoxy

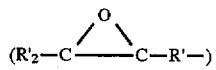
$(R'_2-C \overset{O}{\diagup \diagdown} C-R'-)$ or an amino $(-NR'_2)$ group wherein each R' is independently a hydrogen or an alkyl radical;

$R^2$ is a $C_{1-5}$ alkylene group; and $R^3$ is a $C_{1-3}$ alkyl group.

4 Claims, No Drawings

BIAXIALLY ORIENTED POLYESTER FILM

FIELD OF THE INVENTION

The present invention relates to a biaxially oriented polyester film having improved surface properties, high transparency and excellent UV light shielding ability.

BACKGROUND OF THE INVENTION

Polyesters such as polyethylene terephthalate (PET) are known to possess good chemical stability, physical and mechanical strength, heat resistance, durability, chemical resistance, weather resistance and electrical insulation property; and, therefore, have been widely used in manufacturing various articles including medical devices, capacitors, photographic films, packaging and labelling materials, and magnetic recording media.

In general, it is well known that the slip property and abrasion resistance of a polyester film greatly influences the processability, runnability and quality of the film. In order to impart good runnability, processability and surface properties to a polyester film, inorganic slip agents such as calcium carbonate, silica, alumina and kaolin are often incorporated into the polyester film to form minute protuberances on the surface of the film.

Although such inorganic slip agents are effective in controlling the surface properties of the film, they tend to deteriorate the transparency of the polyester film. Further, when the polyester film is used as a wrapping material, they are not effective in blocking UV light, which leads eventually to the spoilage of the foods contained in the polyester film within a short period of storage. Therefore, a polyester film containing such conventional slip agents is not suitable for use in food wrapping, labeling, solar controlling, glass protecting and photoresisting.

As an attempt to improve the transparency of the polyester film, Japanese Patent Laid-open Publication No. 298538/1992 discloses a polyester film comprising 0.001 to 5 wt % of silica having an average particle size ranging from 0.1 to 5 µm, wherein the silica contains 1 to 30 silanol groups/nm² and 30 to 70% of the silanol groups is treated with a silane coupling agent. However, this method has the disadvantage of requiring a complicated multi-step process which includes the steps of: treating the silica with a coupling agent in an aqueous system; filtering the treated silica particles; drying the filtered particles; and finally dispersing the dry particles in ethylene glycol to obtain an ethylene glycol slurry of the treated silica particles to be used in a subsequent polymerization reaction step.

Accordingly, there exists a need to develop a polyester film having improved surface properties, transparency and UV light shielding ability.

SUMMARY OF THE INVENTION

It is, therefore, a primary object of the present invention to provide a biaxially oriented polyester film having high transparency, improved surface properties and good UV light shielding ability.

In accordance with one aspect of the present invention, there is provided a biaxially oriented polyester film comprising 0.01 to 5 wt %, based on the weight of the polyester, of zinc oxide having an average particle diameter ranging from 0.01 to 5 µm.

In accordance with another aspect of the present invention, there is provided a biaxially oriented polyester film comprising 0.01 to 5 wt %, based on the weight of the polyester, of zinc oxide having an average particle diameter ranging from 0.01 to 5 µm, wherein said zinc oxide is pretreated with a silane coupling agent of formula (I):

wherein, $R^1$ is a methacryl

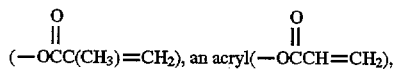

an epoxy

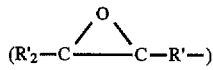

or an amino ($-NR'_2$) group, each R' being independently hydrogen or an alkyl group;

$R^2$ is a $C_{1-5}$ alkylene group; and $R^3$ is a $C_{1-3}$ alkyl group.

DETAILED DESCRIPTION OF THE INVENTION

A polyester resin which may be used to prepare the polyester film of the present invention is produced by a process which comprises transesterifying and polycondensing a dialkyl ester of an aromatic dicarboxylic acid and an aliphatic glycol.

The transesterification and polycondensation reactions may be carried out using a batch or continuous process, while a direct, one-step polymerization may also be used for the preparation of a polyester resin.

Representatives dialkyl esters of aromatic dicarboxylic acids which may be used in preparing a polyester resin for use in the present invention include: dialkyl esters of terephthalic acid, isophthalic acid, naphthalenedicarboxylic acid, cyclohexanedicarboxylic acid, diphenoxyethane dicarboxylic acid, biphenyldicarboxylic acid, diphenyl ether dicarboxylic acid, anthracenedicarboxylic acid and α,β-bis(2-chlorophenoxy)ethane-4,4'-dicarboxylic acid, and others. Among them, dimethyl terephthalate and dimethyl 2,6-naphthalenedicarboxylate are most preferred.

Exemplary aliphatic glycols which may be used in the present invention include: ethylene glycol, trimethylene glycol, tetramethylene glycol, pentamethylene glycol, hexamethylene glycol and hexylene glycol, and others. Among them, ethylene glycol is most preferred.

The polyester which may be preferably used in the present invention is polyethylene terephthalate (PET) obtained from dimethyl terephthalate and ethylene glycol by using any of the conventional transesterification and polycondensation methods well known in the art.

A preferred polyester for use in the present invention is composed of 80 mole % or more of ethylene terephthalate repeating units, the remainder being copolymeric repeating units derived from dicarboxylic acids or oxycarboxylic acids as well as other diols. Such dicarboxylic acids and oxycarboxylic acids include: isophthalic acid, p-(β-hydroxyethoxy)benzoic acid, biphenyldicarboxylic acid, benzophenone-4,4'-dicarboxylic acid, bis(4-carboxyldiphenyl)ethane, adipic acid, sebacic acid, sodium 3,5-di(hydroxycarbonyl)benzenesulfonate, p-oxybenzoic acid and the like; and said other diols include: neopentyl glycol, diethylene glycol, cyclohexanediol and the like.

The transesterification catalyst which can be used in the present invention may be any one conventionally used in the art such as sodium, manganese, potassium, lithium, calcium, magnesium, barium, zinc, zirconium, cobalt, aluminum and cadmium compounds, and a mixture thereof.

The polycondensation catalyst which can be used in the present invention may be any one conventionally used in the art such as titanium, germanium, tin, antimony, zinc, cobalt, aluminum, lead, manganese and calcium compounds, and a mixture thereof.

Zinc oxide, which can be used in the present invention, may have an average particle diameter ranging from 0.01 to 5μm, preferably from 0.01 to 1.5μm; and may be employed in an amount ranging from 0.01 to 5 wt %, preferably, from 0.05 to 3 wt % based on the weight of the polyester resin.

In the present invention, the zinc oxide may be directly introduced at the polymerization step or during the transesterification step of the polyester manufacturing process, while it may also be added after the transesterification step.

In accordance with another aspect of the present invention, the zinc oxide may pretreated with a silane coupling agent by dispersing the zinc oxide in ethylene glycol to obtain a slurry having a zinc oxide concentration of 10 to 60 wt %, more preferably 10 to 55 wt %, and adding a silane coupling agent to the slurry. This optional pretreatment of zinc oxide makes it possible to obtain a stable ethylene glycol slurry of zinc oxide, which is sometimes a more convenient form of zinc oxide in the practice of the present invention.

The silane coupling agent, which can be used in the present invention, has a structure of formula(I) and may be employed in an amount ranging from 0.05 to 5 wt %, preferably, 0.1 to 5 wt % based on the weight of the zinc oxide:

$$R^1-R^2-Si-(OR^3)_3 \quad (I)$$

wherein, $R^1$ is an organic functional group such as a methacryl

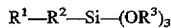
(—OCC(CH$_3$)=CH$_2$), an acryl (—OCCH=CH$_2$), an epoxy

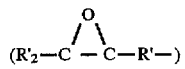
(R'$_2$—C — C—R'—)

or an amino (—NR'$_2$) group, each R' being independently hydrogen or an alkyl group;

$R^2$ is a $C_{1-5}$ alkylene group; and $R^3$ is a $C_{1-3}$ alkyl radical.

The silane coupling agent preferred in practicing the present invention is the compound of the formula (I)wherein $R^2$ is a propylene group and $R^3$ is a methyl or ethyl group.

The silane coupling agent may be preferably added to an ethylene glycol slurry of zinc oxide, while stirring, at a temperature ranging from 30° to 160° C., more preferably 30° to 120° C., and the resulting mixture is preferably maintained for a period ranging from 40 to 80 minutes, more preferably 50 to 70 minutes to treat the surface of the zinc oxide with the silane coupling agent. Then, the treated zinc oxide slurry is introduced to the polymerization system, preferably during the transesterification step at a temperature ranging from 170° to 193° C.

In addition to the additives described above, the polyester film of the present invention may also contain other common additives such as antioxidants, antistatic agents, heat stabilizers and dyes. Such additives may be added at any time during the preparation of the polyester, preferably during the transesterification step or immediately prior to the polycondensation step.

The polyester film of the present invention may be prepared by employing a conventional method, for example, by melt-extruding a polyester resin of molecular weight of about 20,000, which contains the above-described zinc oxide and, optionally, a silane coupling agent as well as other suitable additives, into a cast sheet through a T-die. This sheet is subsequently quenched on a cold roll; then drawn biaxially to produce a biaxially oriented polyester film. The drawing process may be conducted at a temperature ranging from 60° to 150° C.; and the draw ratio may range from 2.5 to 6.0 in either the longitudinal or transverse direction.

The thickness of the polyester film produced as described above may be controlled depending on the usage and it is usually in the range from 2.0 to 200 μm.

The following Examples are intended to illustrate the present invention more specifically, without limiting the scope of the invention.

In the Examples and Comparative Examples, the properties of the polymer film were evaluated in accordance with the following methods.

1. Average Particle Diameter

The average particle diameter was measured as a volumetric average diameter of particles in an ethylene glycol slurry by employing a centrifugation type granulometer (SA-CP2, Shimadzu in Japan).

2. Slurry Viscosity

The viscosity of an ethylene glycol slurry containing zinc oxide and a silane coupling agent was measured at a spindle speed of 60 rpm by employing B type viscometer (Brookfield in England) at room temperature.

3. Molecular Weight

The molecular weight of a polymer was measured by way of a molecular weight measuring apparatus (150C, Waters in U.S.A.) by using m-cresol as a mobile phase at a flow rate of 1 ml/min. and at a column temperature of 100° C.

4. Slurry Stability 100 cc of an ethylene glycol slurry containing zinc oxide and a silane coupling agent was placed in a 100 ml volumetric cylinder and allowed to stand while observing the status of the slurry. The stability of the slurry was evaluated on the basis of the following criteria:

⊚ (excellent): when no phase separation occurs within 7 days

○ (good): when phase separation occurs after 5 days

Δ (common): when phase separation occurs after 3 days

X (poor): when phase separation occurs after 1 days

5. Surface Smoothness

The surface smoothness of a 30 mm×20 mm×50 μm polyester film sample was determined with a contact type surface roughness gauge (SURFCORDER SE-30D, Kosaka Institute in Japan).

Average Surface Roughness at Centerline ($R_a$)

The height of a line parallel to a mean line of a roughness curve, where the areas of both sides of the line become equal.

Highest Height at Centerline ($R_t$)

Distance from the highest point to the lowest point within the area measured.

6. Transparency

The transmittance of a 5 cm×5 cm film sample was measured by employing a haze tester (L-211, Gardener Neotec. in U.S.A.), and the haze value was calculated by the following formula:

Haze value=the amount of light scattered/the amount of light injected

The transparency of the film was classified on the basis of the following criteria:

◎:haze value≦1.0: excellent

○:1.0<haze value≦1.2: good

△:1.2 <haze value≦1.4: common

X:1.4<haze value: poor

7. UV Light Shielding Ability

The shielding of UV light in the wavelength ranging from 260 to 400 nm by a film was measured by employing a UV/visible spectrophotometer (UV-265FW, Shimadzu in Japan), and the UV light shielding coefficient was calculated by the following formula:

UV light shielding coefficient $(B)=(T_s-T_b)\times 100/T_b$ wherein, $T_s$ is the transmittance of a film sample; and $T_b$ is the transmittance of a blank.

The UV light shielding ability of the film was classified on the basis of the following criteria:

◎:20%≦B: excellent

○:15%≦B<20%: good

△:10%≦B<15%: common

X:B<10%: poor

EXAMPLE 1-1

Dimethyl terephthalate and ethylene glycol were mixed at a molar ratio of 1:2 and transesterified in the presence of a transesterification catalyst. To the resultant, zinc oxide having an average particle diameter of 0.1 μm was added as a slip agent in an amount of 0.50 wt % based on the weight of the polyester, and the resulting mixture was polycondensed to obtain a polyester resin having an average molecular weight of about 20,000.

The resin was then melt-extruded using a T-die method to form a cast sheet and the sheet was extended at 90° C. in a draw ratio of 3.0 in both the longitudinal and transverse directions to provide a biaxially oriented polyester film having a thickness of 50 μm.

The properties of the film thus obtained were measured and the results are shown in Table I.

EXAMPLES 1-2 AND 1-3

The procedure of Example 1-1 was repeated except for varying the particle diameter and the amount of the zinc oxide within the scope of the present invention, as shown in Table I.

The properties of the films thus obtained were measured and the results are shown in Table I.

COMPARATIVE EXAMPLES 1-1 AND 1-9

The procedure of Example 1-1 was repeated except that other inorganic particles were employed in place of zinc oxide, as shown in Table I.

The properties of the films thus obtained were measured and the results are shown in Table I.

TABLE I

| | Additives | | | Properties of film | | | | |
|---|---|---|---|---|---|---|---|---|
| | Component | D | Amount | Mn** | Surface Smoothness | | T | UV S |
| | | μm | wt %* | — | $R_t$ (μm) | $R_a$ (μm) | — | — |
| Ex. | | | | | | | | |
| 1-1 | Zinc oxide | 0.10 | 0.50 | 19,100 | 0.014 | 0.099 | ◎ | ◎ |
| 1-2 | Zinc oxide | 0.30 | 0.30 | 18,900 | 0.020 | 0.126 | ◎ | ◎ |
| 1-3 | Zinc oxide | 0.50 | 0.20 | 18,800 | 0.022 | 0.175 | ◎ | ◎ |
| Com. Ex. | | | | | | | | |
| 1-1 | Calcium Carbonate | 0.40 | 0.30 | 17,700 | 0.021 | 0.364 | X | X |
| 1-2 | Calcium Carbonate | 0.54 | 0.20 | 17,800 | 0.023 | 0.400 | X | X |
| 1-3 | Calcium Carbonate | 0.65 | 0.15 | 17,900 | 0.028 | 0.475 | X | X |
| 1-4 | γ-Alumina | 0.10 | 0.25 | 18,600 | 0.018 | 0.288 | ○ | X |
| 1-5 | δ-Alumina | 0.30 | 0.15 | 18,300 | 0.025 | 0.356 | ○ | X |
| 1-6 | Θ-Alumina | 0.35 | 0.14 | 18,400 | 0.026 | 0.363 | ○ | X |
| 1-7 | Calcium Carbonate + γ-Alumina | 0.40/0.10 | 0.30/0.25 | 18,400 | 0.027 | 0.432 | X | X |
| 1-8 | Silica | 2.20 | 0.10 | 19,000 | 0.022 | 0.325 | ○ | X |
| 1-9 | Silica | 2.90 | 0.05 | 18,300 | 0.025 | 0.428 | ○ | X |

[Footnote]

*: based on the weight of polyester;

**: The number average molecular weight;

$R_a$: Average Surface Roughness at Centerline;

$R_t$: Highest Height at Centerline;

D: Average Diameter; T: Transparency; and UV S: UV light shielding ability.

EXAMPLE 2-1

An ethylene glycol slurry containing 20 wt % of zinc oxide was prepared, and then the average particle size of zinc oxide was measured. Thereto was added $H_2N(CH_2)_3Si(OCH_2CH_3)_3$, a silane coupling agent, in an amount of 0.3 wt % based on the weight of zinc oxide employed, to treat the surface of the zinc oxide for 55 minutes. The viscosity of the slurry thus obtained was measured.

Dimethyl terephthalate and ethylene glycol were mixed at a molar ratio of 1:2 and the resulting mixture was transesterified in the presence of zinc acetate, and thereto were added the ethylene glycol slurry obtained above in an amount required to produce a polyester resin containing 0.50 wt % of treated zinc oxide, followed by a polycondensation step carried out at a temperature ranging from 250° to 285° C. in the presence of antimony trioxide to obtain a polyester resin having a molecular weight of approximately 20,000.

The polyester resin thus obtained was dried and melt-extruded to form a cast sheet. The sheet was stretched in a draw ratio of 3.0 in both longitudinal and transverse directions at 90° C. to provide a biaxially oriented polyester film having a thickness of 50 μm.

The properties of the film were measured and the results are shown in Table II.

EXAMPLES 2-2 AND 2-3

The procedure of Example 2-1 was repeated except for varying the particle diameter and the amount of the zinc oxide within the scope of the present invention, as shown in Table II.

The properties of the films thus obtained were measured and the results are shown in Table II.

The results in Tables I and II show that the polyester films containing zinc oxide in accordance with the present invention have excellent surface property, transparency, and UV light shielding ability, which are superior to those of the conventional polyester films containing other inorganic slip agents. Therefore, the biaxially extended polyester film prepared by the present invention are better suited for use in wrapping materials, labels, glass protecting films, photoresists and the like.

While the invention has been described with respect to the specific embodiments, it should be recognized that various modifications and changes may be made by those skilled in the art to the invention which also fall within the scope of the invention as defined by the appended claims.

What is claimed is:

1. A biaxially oriented polyester film comprising 0.01 to 5 wt %, based on the weight of the polyester, of zinc oxide having an average particle diameter ranging from 0.01 to 5 μm.

2. The film of claim 1, wherein said zinc oxide is pretreated with a silane coupling agent of formula (I):

$$R^1\text{—}R^2\text{—Si—}(OR^3)_3 \qquad (I)$$

wherein, $R^1$ is a methacryl

an epoxy

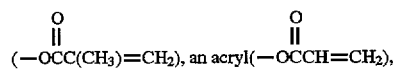

or an amino ($-NR'_2$) group, wherein each R' is independently a hydrogen or an alkyl group;

$R^2$ is a $C_{1-5}$ alkylene group; and $R^3$ is a $C_{1-3}$ alkyl group.

TABLE II

| | Additives | | | | Properties of film | | | | | |
| | Zinc Oxide | | Coupling Agent | Slurry | | Surface Smoothness | | | UV | |
| Ex. | D μm | Amount wt %* | Amount wt %** | Vis.*** cps | Mn**** | $R_a$ μm | $R_t$ μm | S.S. | T | S |
|---|---|---|---|---|---|---|---|---|---|---|
| 2-1 | 0.10 | 0.50 | 0.5@ | 110 | 18,300 | 0.011 | 0.093 | ⊙ | ⊙ | ⊙ |
| 2-2 | 0.30 | 0.30 | 0.6@@ | 105 | 18,700 | 0.017 | 0.121 | ⊙ | ⊙ | ⊙ |
| 2-3 | 0.50 | 0.20 | 0.7@@@ | 92 | 18,600 | 0.018 | 0.165 | ⊙ | ⊙ | ⊙ |

[Footnote]
*: based on the weight of the polyester;
**: based on the weight of the zinc oxide;
***: The zinc oxide content of the slurry was 20 wt %;
****: The number average molecular weight;
$R_a$: Average surface roughness at centerline;
$R_t$: Highest height at centerline;
@: $H_2N(CH_2)_3Si(OC_2H_5)_3$; @@: $CH_2=C(CH_3)COO(CH_2)_3Si(OCH_3)_3$;

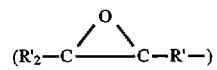

@@@: $CH_2\text{—}CHCH_2O(CH_2)_3Si(OCH_3)_3$;
D: Average Diameter; S.S.: Slurry Stability;
T: Transparency; and
UV S: UV light shielding ability.

3. The film of claim 2, wherein the silane coupling agent is selected from the group consisting of $H_2N(CH_2)_3Si(OC_2H_5)_3$, $CH_2=C(CH_3)COO(CH_2)_3Si(OCH_3)_3$ and

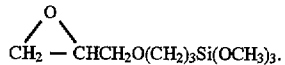
$CH_2 - CHCH_2O(CH_2)_3Si(OCH_3)_3$.

4. The film of claim 2, wherein the pretreatment of said zinc oxide is carried out by: dispersing the zinc oxide in ethylene glycol and adding thereto the silane coupling agent in an amount ranging from 0.05 to 5 wt % based on the weight of the zinc oxide employed.

* * * * *